US011050398B2

(12) United States Patent
Wang

(10) Patent No.: US 11,050,398 B2
(45) Date of Patent: Jun. 29, 2021

(54) LARGE INPUT CURRENT DETECTION AND FAST RESPONSE OPTICAL RECEIVER

(71) Applicant: Analog Devices International Unlimited Company, Limerick (IE)

(72) Inventor: Wei Wang, Shanghai (CN)

(73) Assignee: Analog Devices International Unlimited Company, Limerick (IE)

(*) Notice: Subject to any disclaimer, the term of this patent is extended or adjusted under 35 U.S.C. 154(b) by 296 days.

(21) Appl. No.: 16/249,473

(22) Filed: Jan. 16, 2019

(65) Prior Publication Data

US 2020/0228078 A1    Jul. 16, 2020

(51) Int. Cl.
   *H03F 3/45* (2006.01)

(52) U.S. Cl.
   CPC .......... *H03F 3/45475* (2013.01); *H03F 2203/45616* (2013.01)

(58) Field of Classification Search
   CPC ........... H03F 3/45475; H03F 2203/45616
   See application file for complete search history.

(56) References Cited

U.S. PATENT DOCUMENTS

| 5,208,693 | A  | 5/1993  | Geller et al.  |
| 5,541,759 | A  | 7/1996  | Neff et al.    |
| 5,692,507 | A  | 12/1997 | Seppi et al.   |
| 5,804,997 | A  | 9/1998  | Nishizono et al. |
| 6,359,517 | B1 | 3/2002  | Colaco         |
| 6,909,081 | B2 | 6/2005  | Bloehbaum et al. |
| 2003/0127672 | A1* | 7/2003 | Rahn ............... H01L 27/14609 257/291 |
| 2003/0197563 | A1 | 10/2003 | Nishizono |
| 2012/0082297 | A1 | 4/2012  | Fox |
| 2016/0061658 | A1 | 3/2016  | Sugizaki et al. |
| 2020/0412991 | A1* | 12/2020 | Ishii ............... H04N 5/37452 |

FOREIGN PATENT DOCUMENTS

| JP | S61231698 A | 10/1986 |
| JP | H06152535 A | 5/1994 |
| JP | H08162858   | 6/1996 |
| JP | 2006191211 A | 7/2006 |

OTHER PUBLICATIONS

Bielecki, Z., "Readout electronics for optical detectors", Opto-Electronics Review, 12(1), (2004), 10 pgs.
"International Application No. PCT/EP2019/052057, International Search Report dated Oct. 11, 2019", 5 pgs.
"International Application No. PCT/EP2019/052057, Written Opinion dated Oct. 11, 2019", 8 pgs.

* cited by examiner

*Primary Examiner* — Georgia Y Epps
*Assistant Examiner* — Don J Williams
(74) *Attorney, Agent, or Firm* — Schwegman Lundberg & Woessner, P.A.

(57) ABSTRACT

A clamp circuit can control a clamp transistor such that a change in a photodiode current detection voltage signal in an optical receiver circuit can control the clamp transistor to change state when a difference of a clamp voltage and the photodiode current detection voltage signal exceeds a threshold voltage of the clamp transistor. Using a feedback loop, the clamp circuit can accurately clamp a current when the photodiode current is larger than a detect current threshold.

20 Claims, 4 Drawing Sheets

LARGE INPUT CURRENT DETECTION AND FAST RESPONSE OPTICAL RECEIVER

FIELD OF THE DISCLOSURE

This document pertains generally, but not by way of limitation, to optical receiver circuits.

BACKGROUND

An optical receiver circuit receives optical data from an optical transmitter circuit. A photodiode in the optical receiver circuit can convert the received optical data into a photodiode current. The amount of photodiode current can represent the logic level of the received optical data, which the optical receiver circuit can use to generate an electrical signal representing the received optical data.

SUMMARY OF THE DISCLOSURE

This disclosure describes, among other things, techniques to clamp large photodiode currents, which can cause optical receiver circuits to not function properly. Using various techniques of this disclosure, a clamp circuit can control a clamp transistor such that a change in the photodiode current detection voltage signal controls the clamp transistor to change state when a difference of a clamp voltage and the photodiode current detection voltage signal exceeds a threshold voltage of the clamp transistor. Using a feedback loop, the clamp circuit can accurately clamp a current when the photodiode current is larger than a detect current threshold, e.g., 5 microamps.

In some aspects, this disclosure is directed to a low power and fast response optical receiver circuit, the circuit comprising a clamp circuit including a clamp transistor, the clamp circuit configured to operate the clamp transistor such that a change in a photodiode current detection voltage signal controls the clamp transistor to change state when a magnitude of a difference of a clamp voltage and the photodiode current detection voltage signal exceeds a threshold voltage magnitude of the clamp transistor.

In some aspects, this disclosure is directed to a low power and fast response method of operating an optical receiver circuit, the method comprising generating a photodiode current detection voltage signal; generating a clamp voltage in response to a difference between a clamp reference voltage and the photodiode current detection voltage signal; controlling a clamp transistor to change state when a magnitude of a difference of the clamp voltage and the photodiode current detection voltage signal exceeds a threshold voltage magnitude of the clamp transistor.

In some aspects, this disclosure is directed to a low power and fast response optical receiver circuit, the circuit comprising means for generating a photodiode current detection voltage signal; means for generating a clamp voltage in response to a difference between a clamp reference voltage and the photodiode current detection voltage signal; and means for controlling a clamp transistor to change state when a magnitude of a difference of the clamp voltage and the photodiode current detection voltage signal exceeds a threshold voltage magnitude of the clamp transistor.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

A photodiode in an optical receiver circuit can convert received optical data into corresponding photodiode current. A photodiode current detection voltage signal can be compared to a reference voltage and, in response, an output signal can be generated that represents the received optical data. For example, when there is no photodiode current, the photodiode current detection voltage signal can be greater than the reference voltage and, in response, the output signal of the receiver can be a logic high level; when there is photodiode current, the photodiode current detection voltage signal can be less than the reference voltage and, in response, the output signal of the receiver can be a logic low level. However, if there is a large amount of photodiode current, the photodiode current detection voltage signal can be very small which can cause the optical receiver circuit to not function properly.

In addition, existing optical receiver circuits can have limited input current ranges due to the transimpedance amplifier output swing and feedback resistor values, for example. Further, the transimpedance amplifier can consume a large amount of power to settle larger output signals. The present inventor has recognized a need to provide a large input current detection and fast response optical receiver circuit.

Using various techniques of this disclosure, a clamp circuit can control a clamp transistor such that a change in the photodiode current detection voltage signal controls the clamp transistor to change state when a difference of a clamp voltage and the photodiode current detection voltage signal exceeds a threshold voltage of the clamp transistor. Using a feedback loop, the clamp circuit can accurately clamp a current when the photodiode current is larger than a detect current threshold, e.g., 5 microamps. In some example configurations, the clamp circuit of this disclosure can allow up to 200 microamps of photodiode current, thereby providing a larger optical receiver input current range than other techniques.

Figure 1:
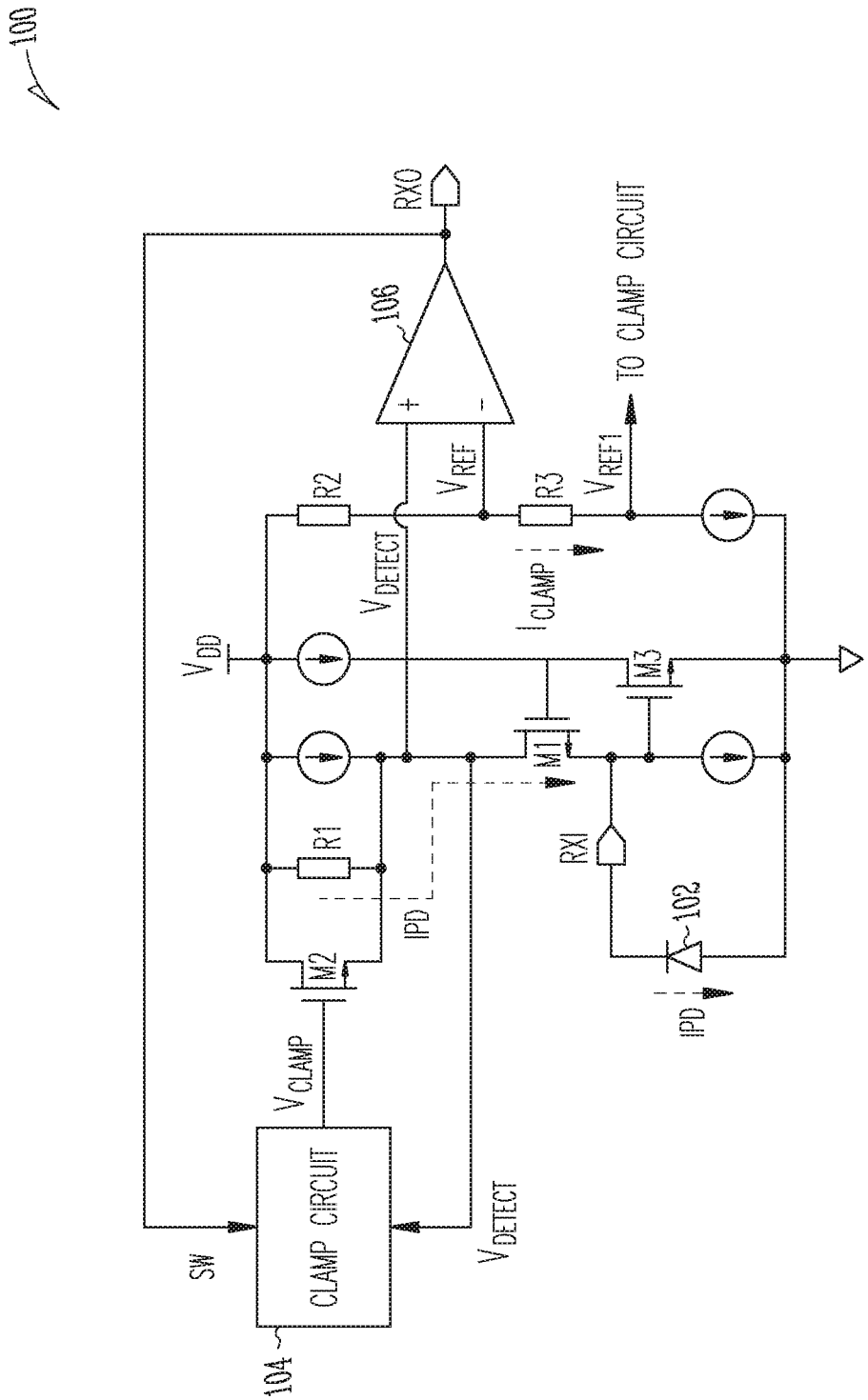
FIG. 1 is a schematic diagram of an example of an optical receiver circuit that can implement various techniques of this disclosure.

FIG. 1 is a schematic diagram of an example of an optical receiver circuit that can implement various techniques of this disclosure. The optical receiver circuit 100 of FIG. 1 can include an optical detector circuit having a photodiode 102 coupled to an input pin RXI of the optical receiver circuit. The photodiode 102 can convert optical data received from a transmitter (not depicted) to an electrical signal that can be output at the output pin RXO of the optical receiver circuit 100. This disclosure also refers to the output signal itself as RXO with the distinction between the output pin and the signal itself made where necessary for clarity.

The optical receiver circuit 100 can include a common gate stage transistor M1 for receiver input and can include a common source stage amplifier, which can include transistor M3, to reduce the input impedance of RXI. As described in more detail below, the optical receiver circuit 100 can include a clamp transistor M2 coupled to a clamp circuit 104. Although shown as a field-effect transistor (FET), e.g., N-type, coupled to an upper power supply voltage $V_{DD}$, in other configurations, the clamp transistor M2 can be a native transistor, a bipolar junction transistor (BJT), e.g., NPN, or other type of transistor.

In operation, when data is received at the input pin RXI, the photodiode 102 can generate a photodiode current $I_{PD}$. The photodiode current $I_{PD}$ through a resistor R1 can generate the photodiode current detection voltage signal $V_{DETECT}$ that can be compared to a reference voltage $V_{REF}$, e.g., set by resistor R2, using a comparator circuit 106. The comparator circuit 106 can output a result of the comparison to the RXO output pin. However, if there is a large amount of photodiode current $I_{PD}$, e.g., 5 microamps to about 100 microamps, the photodiode current detection voltage signal $V_{DETECT}$ can be very small which can cause the optical receiver circuit to not function properly. To overcome these challenges and permit the optical receiver circuit to function properly even when there is a large photodiode current, e.g., about 200 microamps, the clamp circuit 104 can control the clamp transistor M2 such that a change in the photodiode current detection voltage signal $V_{DETECT}$ can control the clamp transistor M2 to change state, e.g., turn ON and OFF, when a difference of a clamp voltage $V_{CLAMP}$ and the photodiode current detection voltage signal $V_{DETECT}$ exceeds a threshold voltage, e.g., a $V_{TH}$, of the clamp transistor M2.

The clamp circuit 104 (shown in more detail in FIG. 2) can receive the photodiode current detection voltage signal $V_{DETECT}$, a switch signal SW, and a clamp reference voltage signal $V_{REF1}$. Using these signals, the clamp circuit 104 can generate and couple the clamp voltage $V_{CLAMP}$ to the clamp transistor M2. The clamp voltage $V_{CLAMP}$ can be held on a first terminal, e.g., a gate terminal, of the clamp transistor M2. As the photodiode current detection voltage signal $V_{DETECT}$ changes, the voltage on a second terminal, e.g., source terminal, of the clamp transistor M2 changes. When a magnitude of a difference of the clamp voltage $V_{CLAMP}$ and the photodiode current detection voltage signal $V_{DETECT}$ exceeds a threshold voltage, e.g., a threshold voltage $V_{TH}$ of the clamp transistor M2, the clamp transistor M2 can change state, e.g., turn ON and OFF. The operation of the optical receiver circuit 100 will be described in more detail below in combination with FIG. 2.

Figure 2:
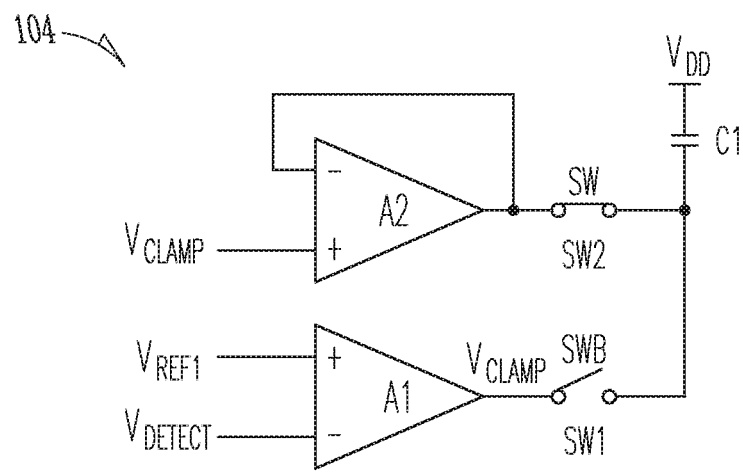
FIG. 2 is a schematic diagram of an example of the clamp circuit of FIG. 1.

FIG. 2 is a schematic diagram of an example of the clamp circuit 104 of FIG. 1. The clamp circuit 104 can include a first amplifier circuit A1 configured to receive the photodiode current detection voltage signal $V_{DETECT}$ at its inverting input and the first reference voltage signal $V_{REF1}$ at its non-inverting input and generate the clamp voltage $V_{CLAMP}$. The clamp circuit can also include a second amplifier circuit A2, e.g., a buffer amplifier. The second amplifier circuit A2 can receive the clamp voltage $V_{CLAMP}$ and, for example, output a buffered representation of $V_{CLAMP}$.

As seen in FIG. 2, the outputs of the first and second amplifier circuits A1, A2 can be coupled to a capacitive component C1, e.g., a capacitor or other device capable of providing capacitance. In some examples, the capacitive component C1 can have a capacitance of about 10 picofarads. A first terminal of the capacitive component C1 can be coupled to the upper power supply voltage $V_{DD}$ and a second terminal can be coupled to the clamp transistor M2.

In some example configurations, the clamp circuit 104 can include first and second switches SW1 and SW2 coupled, respectively, to the outputs of the first and second amplifier circuits A1, A2. The output signal SW of the comparator circuit 106 of FIG. 1, e.g., generated in response to the output signal at the output pin RXO of the optical receiver circuit 100, can control the operation of the first and second switches SW1, SW2. In some example configurations, the output signal SW can control operation of the first switch SW2 and a complement of the output signal SW, namely signal SWB, can control operation of the second switch SW1.

In some example configurations and as described in more detail below, a time delay (shown as $T_D$ in the timing diagram in FIG. 3) can be provided between when the output signal of the comparator circuit 106 is generated and when the first and second switches operate. For example, one or more logic gates can be coupled between an output of the comparator circuit 106 and the first and second switches, as described in more detail below. In some implementations, the time delay $T_D$ can be programmable. For example, a control circuit can control a number of logic gates to include in series between the clamp circuit and the output RXO by controlling one or more switches in the series delay chain to short out.

The operation of the clamp circuit 104 of FIG. 2 and the optical receiver circuit 100 of FIG. 1 will now be described. When the photodiode current $I_{PD}$ is less than the clamp threshold current $I_{CLAMP}$, e.g., where the clamp threshold current that is determined by the clamp reference voltage $V_{REF1}$ is about 1 microamp, which results in the photodiode current detection voltage signal $V_{DETECT}$ being less than the clamp reference voltage $V_{REF1}$, the output of the first amplifier circuit A1, namely the voltage $V_{CLAMP}$, is low and the clamp transistor M2 is OFF.

When the photodiode current $I_{PD}$ toggles from "0" to "1" and is larger than the clamp threshold current $I_{CLAMP}$, the first amplifier circuit A1 generates the voltage $V_{CLAMP}$. During a first time when the first amplifier circuit A1 generates the voltage $V_{CLAMP}$, the switch SW1 can remain OFF, which keeps the loading on the amplifier circuit A1 low, thereby allowing the voltage $V_{CLAMP}$ to settle quickly.

In addition, the voltage on a terminal, e.g., source terminal, of the clamp transistor M2 decreases such that a difference in the magnitude between the voltage on the terminal and the voltage on another terminal, e.g., a gate terminal, exceeds a threshold voltage magnitude $V_{TH}$ of the clamp transistor. For example, when the source terminal voltage on the clamp transistor M2 decreases due to the increase in the photodiode current $I_{PD}$, the gate-to-source voltage ($V_{GS}$) of the clamp transistor M2 will be greater than the threshold voltage $V_{TH}$ and the clamp transistor M2 can turn ON. The comparator circuit 106 can compare the photodiode current detection voltage signal, e.g., at its non-inverting input, and a reference voltage $V_{REF}$, e.g., at its inverting input, and generate an output signal, e.g., logic low level, at the output pin RXO of the optical receiver circuit 100.

When the photodiode current detection voltage signal $V_{DETECT}$ is approximately the same as the clamp reference voltage $V_{REF1}$, the voltage $V_{CLAMP}$ can be stable. Then, the switch SW1 can turn ON, which can sample the voltage $V_{CLAMP}$ to the capacitive element C1. The switch SW2, which acts complementary to the switch SW1, can turn OFF.

When the photodiode current $I_{PD}$ toggles from "1" to "0", the voltage on a terminal, e.g., source terminal, of the clamp transistor M2 increases such that a difference in the magnitude between the voltage on the terminal and the voltage on another terminal, e.g., a gate terminal, decreases below a threshold voltage magnitude $V_{TH}$ of the clamp transistor. For example, when the source terminal voltage on the clamp transistor M2 increases due to the decrease in the photodiode current $I_{PD}$, the gate-to-source voltage ($V_{GS}$) of the clamp transistor M2 will be less than the threshold voltage $V_{TH}$ and the clamp transistor M2 can turn OFF. The comparator circuit 106 can compare the photodiode current detection voltage signal $V_{DETECT}$, e.g., at its non-inverting input, and a reference voltage $V_{REF}$, e.g., at its inverting input, and generate an output signal, e.g., logic high level, at the output pin RXO of the optical receiver circuit. The switch SW2 can turn ON, which can allow the amplifier circuit A2 and the capacitive element C1 to hold the voltage $V_{CLAMP}$ which can help the voltage $V_{CLAMP}$ settle quickly for the next toggle of the photodiode current $I_{PD}$.

For low latency, the optical receiver output at pin RXO should toggle from a first level, e.g., logic low, to a second level, e.g., logic high, very quickly. If the photodiode current Iris is within its operating range and the photodiode current detection voltage signal $V_{DETECT}$ is pulled below the reference voltage $V_{REF}$, the output of the optical receiver circuit is a logic low level. However, if the photodiode current $I_{PD}$ is too large, the photodiode current detection voltage signal $V_{DETECT}$ can be pulled so far below the reference voltage $V_{REF}$ that the comparator circuit 106 can saturate and will take time to recover. Using the techniques of this disclosure, the clamp transistor M2 can hold the photodiode current detection voltage signal $V_{DETECT}$ at a value that lets the comparator circuit 106 recover. That is, it can be held at a value less than the voltage reference $V_{REF}$ so that the output of the comparator circuit 106 is correct but not much lower so that it can recover quickly.

Because the amplifier circuit A1 operates when the switch SW1 is OFF, the loading on the amplifier circuit A1 is low and the bandwidth of the amplifier circuit A1 can be large with low power consumption. That is, when the amplifier circuit A1 operates and switch SW1 is OFF, the loading capacitance of the amplifier circuit A1 is small, e.g., about 10 picofarad (pF) with capacitor C1 disconnected, the bandwidth of the amplifier circuit A1 will be larger, and the amplifier circuit A1 does not need a large current for the slew rate to settle in the 10 pF C1 capacitor.

Figure 3:
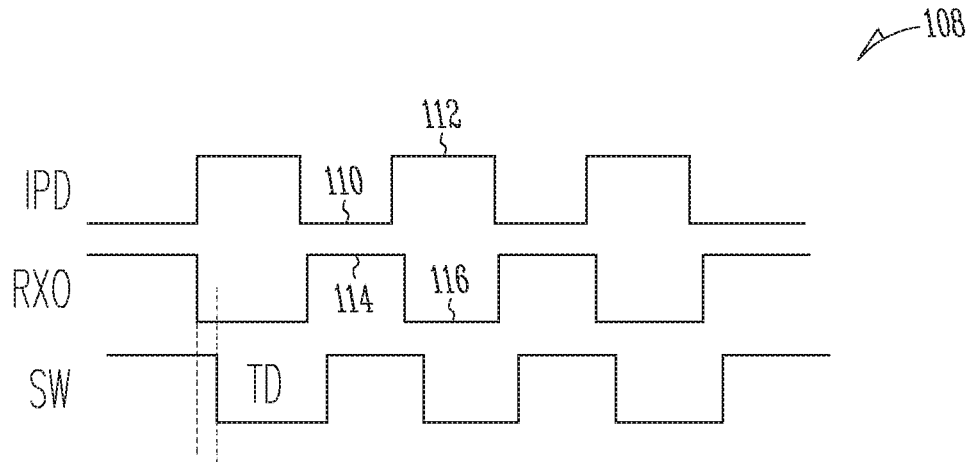
FIG. 3 is an example of a timing diagram depicting a relationship between the photodiode current $I_{PD}$, the optical receiver circuit output signal RXO, and the switch control signal SW.

FIG. 3 is an example of a timing diagram 108 depicting a relationship between the photodiode current $I_{PD}$, the optical receiver circuit output signal RXO, and the switch control signal SW. In the example configuration shown, when the photodiode current $I_{PD}$ toggles from a logic low 110 to a logic high 112, the optical receiver circuit output RXO toggles a logic high 114 to a logic low 116.

The output signal SW of the comparator circuit 106 of FIG. 1, e.g., corresponding to the output signal RXO of the optical receiver circuit 100, can control the operation of the first and second switches SW1, SW2. As mentioned above, in some example configurations a time delay $T_D$ can be provided between when the output signal RXO is generated and when the first and second switches SW1, SW2 of FIG. 2 operate. For example, one or more logic gates (shown in FIG. 4) can be coupled between an output of the comparator circuit and the first and second switches. In some implementations, the time delay can be programmable.

Figure 4:
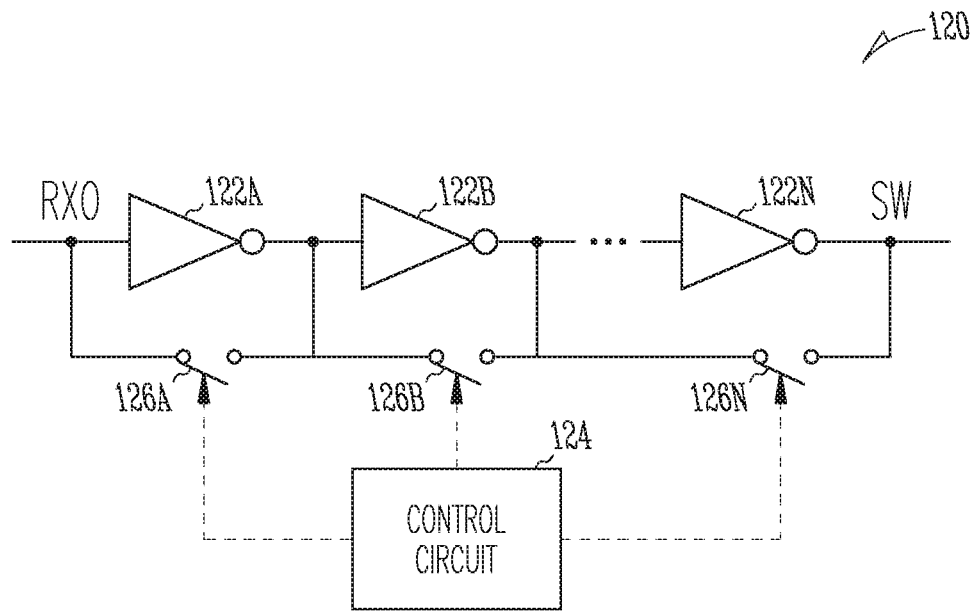
FIG. 4 is an example of a timing delay circuit that can be used to provide the time delay $T_D$ of FIG. 3.

FIG. 4 is an example of a timing delay circuit 120 that can be used to provide the time delay $T_D$ of FIG. 3. The timing delay circuit 120 can include one or more logic gates 122A-122N, e.g., logic gates, that can add the time delay $T_D$ between when the output signal RXO is generated and when the first and second switches SW1, SW2 of FIG. 2 operate. As described above, adding the time delay $T_D$ can keep the switch SW1 OFF so the loading on the amplifier circuit A1 is low thereby allowing the voltage $V_{CLAMP}$ to settle quickly, for example.

In some implementations, the time delay $T_D$ can be programmable. For example, a control circuit 124 can control one or more switches 126A-126N to open in order to include one or more corresponding logic gates 122A-122N in series between the clamp circuit and the output pin RXO. By closing one or more switches, e.g., switches 126B-126N, the corresponding logic gates 122B-122N can be bypassed and only the delay of the logic gate corresponding to the open switch(es), e.g., logic gate 122A, will be included.

Figure 5:
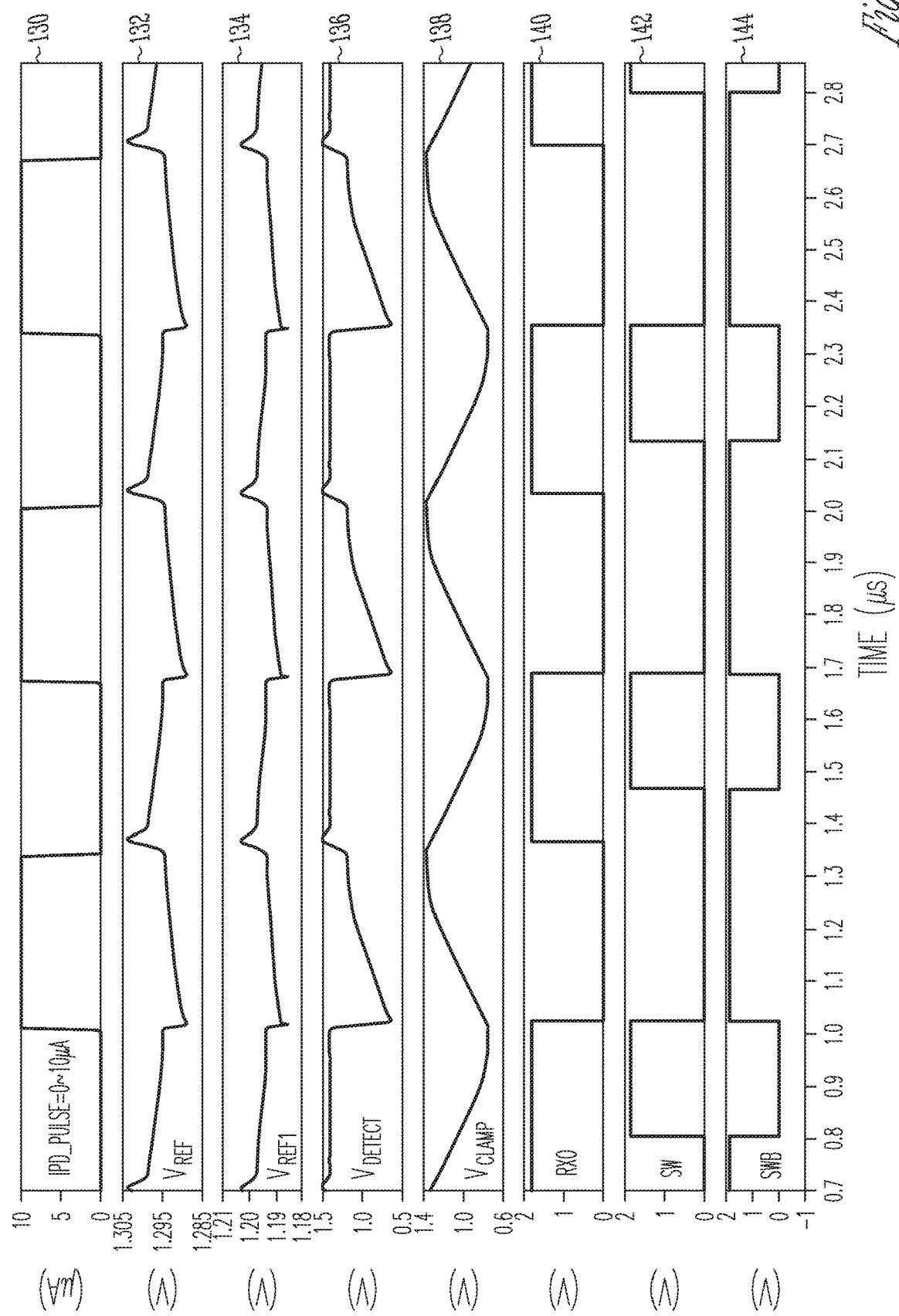
FIG. 5 is an example of a timing diagram depicting relationships between various signals of the optical receiver circuit of FIG. 1.

FIG. 5 is an example of a timing diagram depicting relationships between various signals of the optical receiver circuit 100 of FIG. 1. The x-axis represents time in microseconds and each signal is plotted against a corresponding y-axis representing volts. Beginning at the top of the timing diagram, the signals include the photodiode current $I_{PD}$ 130, the reference voltage $V_{REF}$ 132, the clamp reference voltage signal $V_{REF1}$ 134, the photodiode current detection voltage signal $V_{DETECT}$ 136, the clamp voltage $V_{CLAMP}$ 138, the optical receiver output signal RXO 140, the switch signal SW 142, and the switch signal SWB 144.

As seen in FIG. 5, when the photodiode current $I_{PD}$ 130 toggles from a high level to a low level, the optical receiver output signal RXO 140 toggles from a low level to a high level followed by the switch signal SW 142 toggling from a low level to a high level after a time delay. The switch signal SWB 144 operates opposite to the switch signal SW 142 as the two signals operate in a complementary manner.

When the photodiode current $I_{PD}$ 130 toggles from a low level to a high level, the photodiode current detection voltage signal $V_{DETECT}$ 136 decreases which causes the clamp transistor M2 in FIG. 1 to turn ON when its gate-to-source voltage exceeds its threshold voltage, e.g., when the voltage $V_{GS} > V_{TH}$ of the transistor M2. The difference between the clamp reference voltage signal $V_{REF1}$ 134 and the photodiode current detection voltage signal $V_{DETECT}$ 136 causes the amplifier circuit A1 of FIG. 2 to generate and output the clamp voltage $V_{CLAMP}$ 138.

During the cycle, the photodiode current detection voltage signal $V_{DETECT}$ 136 begins to recover and tracks the increasing clamp voltage $V_{CLAMP}$ 138. The photodiode current detection voltage signal $V_{DETECT}$ 136 increases such that when the photodiode current $I_{PD}$ 130 toggles from a high level to a low level, the optical receiver output signal RXO 140 will toggle to a high level quickly because the increased photodiode current detection voltage signal $V_{DETECT}$ 136 was closer to the reference voltage $V_{REF}$ 132. In this manner, the latency of the optical receiver circuit 100 can be reduced.

Notes

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These embodiments are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the even of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein may be machine or computer-implemented at least in part. Some examples may include a computer-readable medium or machine-readable medium encoded with instructions operable to configure an electronic device to perform methods as described in the above examples. An implementation of such methods may include code, such as microcode, assembly language code, a higher-level language code, or the like. Such code may include computer readable instructions for performing various methods. The code may form portions of computer program products. Further, in an example, the code may be tangibly stored on one or more volatile, non-transitory, or non-volatile tangible computer-readable media, such as during execution or at other times. Examples of these tangible computer-readable media may include, but are not limited to, hard disks, removable magnetic disks, removable optical disks (e.g., compact discs and digital video discs), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments may be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments may be combined with each other in various combinations or permutations. The scope of the invention should be determined with reference to the appended claims, along with the full scope of equivalents to which such claims are entitled.

The claimed invention is:

1. A low power and fast response optical receiver circuit, the circuit comprising:
   a clamp circuit including:
      a clamp transistor, the clamp circuit configured to operate the clamp transistor such that a change in a photodiode current detection voltage signal controls the clamp transistor to change state when a magnitude of a difference of a clamp voltage and the photodiode current detection voltage signal exceeds a threshold voltage magnitude of the clamp transistor;
      a first amplifier circuit configured to generate the clamp voltage in response to a difference between a clamp reference voltage and the photodiode current detection voltage signal; and
      a resistor coupled across two terminals of the clamp transistor, wherein the photodiode current detection voltage signal is generated by a photodiode current through the resistor.

2. The circuit of claim 1, wherein the clamp circuit comprises:
   a capacitor,
   wherein a first terminal of the clamp transistor is configured to be coupled to the clamp voltage and a second terminal of the clamp transistor is configured to be coupled to the photodiode current detection voltage signal.

3. The circuit of claim 2, wherein the clamp circuit comprises:
   a first switch configured to couple an output of the first amplifier circuit to the capacitor;
   a second switch configured to couple and hold the clamp voltage on the capacitor to allow the clamp voltage on the first terminal of the clamp transistor to settle when a photodiode current toggles from a first state to a second state.

4. The circuit of claim 3, wherein the first switch and the second switch are controlled in a complementary manner in response to an output signal of the optical receiver circuit.

5. The circuit of claim 3, further comprising:
   a second amplifier circuit coupled to the second switch and configured to couple the clamp voltage to the capacitor.

6. The circuit of claim 3, further comprising:
   a comparator circuit configured to compare a reference voltage and the photodiode current detection voltage signal and generate an output signal of the optical receiver circuit.

7. The circuit of claim 6, further comprising:
   at least one logic gate coupled between an output of the comparator circuit and the first and second switches, wherein the at least one logic gate is configured to provide a delay between when the output signal of the comparator circuit is generated and when the first and second switches operate.

8. The circuit of claim 1, wherein the transistor is an N-type field-effect transistor coupled to an upper supply voltage.

9. A low power and fast response method of operating an optical receiver circuit, the method comprising:
generating a photodiode current detection voltage signal in response to a photodiode current through a resistor coupled across two terminals of a clamp transistor;
generating a clamp voltage in response to a difference between a clamp reference voltage and the photodiode current detection voltage signal; and
controlling a clamp transistor to change state when a magnitude of a difference of the clamp voltage and the photodiode current detection voltage signal exceeds a threshold voltage magnitude of the clamp transistor.

10. The method of claim 9, further comprising:
coupling a first terminal of the clamp transistor to the clamp voltage and a second terminal of the clamp transistor to the photodiode current detection voltage signal.

11. The method of claim 9, further comprising:
coupling a first switch to an output of the first amplifier circuit to a capacitor;
controlling a second switch to couple and hold the clamp voltage on the capacitor to allow the clamp voltage on a first terminal of the clamp transistor to settle when a photodiode current toggles from a first state to a second state.

12. The method of claim 11, further comprising:
while the first switch is OFF during a first time, operating the first amplifier circuit to generate the clamp voltage.

13. The method of claim 11, further comprising:
controlling the first switch and the second switch in response to an output signal of the optical receiver circuit.

14. The method of claim 13, further comprising
controlling the first switch and the second switch in complementary manner.

15. The method of claim 13, wherein controlling the first switch and the second switch in response to the output signal of the optical receiver circuit includes:
providing a time delay to the output signal of the optical receiver circuit.

16. The method of claim 9, further comprising:
comparing a reference voltage and the photodiode current detection voltage signal and generating an output signal of the optical receiver circuit.

17. A low power and fast response optical receiver circuit, the circuit comprising:
a clamp transistor and a resistor coupled across two terminals of the clamp transistor, wherein a photodiode current detection voltage signal is generated by a photodiode current through the resistor;
means for generating a clamp voltage in response to a difference between a clamp reference voltage and the photodiode current detection voltage signal; and
means for controlling a clamp transistor to change state when a magnitude of a difference of the clamp voltage and the photodiode current detection voltage signal exceeds a threshold voltage magnitude of the clamp transistor.

18. The circuit of claim 17, further comprising:
first means for coupling an output of the first amplifier circuit to a capacitor;
second means for coupling and holding the clamp voltage on the capacitor to allow the clamp voltage on a first terminal of the clamp transistor to settle when a photodiode current toggles from a first state to a second state.

19. The circuit of claim 18, further comprising:
means for providing a time delay to an output signal of the optical receiver circuit to control the first means for coupling and the second means for coupling.

20. The circuit of claim 18, wherein the first means for coupling and the second means for coupling are controlled in a complementary manner in response to an output signal of the optical receiver circuit.

* * * * *